United States Patent
Iwatsuki

(10) Patent No.: US 9,972,705 B2
(45) Date of Patent: May 15, 2018

(54) METHOD FOR MANUFACTURING SEMICONDUCTOR DEVICE

(71) Applicant: DENSO CORPORATION, Kariya, Aichi-pref. (JP)

(72) Inventor: Masashi Iwatsuki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days. days.

(21) Appl. No.: 15/594,727

(22) Filed: May 15, 2017

(65) Prior Publication Data

US 2017/0358668 A1    Dec. 14, 2017

(30) Foreign Application Priority Data

Jun. 9, 2016    (JP) ................................. 2016-115711

(51) Int. Cl.

| | |
|---|---|
| *H01L 27/108* | (2006.01) |
| *H01L 29/76* | (2006.01) |
| *H01L 29/739* | (2006.01) |
| *G01R 31/26* | (2014.01) |
| *H01L 21/78* | (2006.01) |
| *H01L 21/84* | (2006.01) |
| *H01L 27/06* | (2006.01) |
| *H01L 29/06* | (2006.01) |

(52) U.S. Cl.
CPC ...... *H01L 29/7395* (2013.01); *G01R 31/2621* (2013.01); *H01L 21/78* (2013.01); *H01L 21/84* (2013.01); *H01L 27/0611* (2013.01); *H01L 29/0657* (2013.01)

(58) Field of Classification Search
CPC ......... H01L 27/10876; H01L 27/10841; H01L 29/7827; H01L 27/10823; H01L 29/66666; H01L 29/0653; H01L 29/7397; H01L 29/7395; H01L 29/0657
USPC ....................................................... 257/302
See application file for complete search history.

(56) References Cited

U.S. PATENT DOCUMENTS

| | | | |
|---|---|---|---|
| 9,601,336 B2 * | 3/2017 | Zhou ................ | H01L 29/42368 |
| 2013/0248958 A1 * | 9/2013 | Juengling ......... | H01L 27/10823 |
| | | | 257/302 |

FOREIGN PATENT DOCUMENTS

| | | |
|---|---|---|
| JP | H06-310579 A | 11/1994 |
| JP | 2006-196711 A | 7/2006 |
| JP | 2010-205824 A | 9/2010 |

(Continued)

*Primary Examiner* — Theresa T Doan
(74) *Attorney, Agent, or Firm* — Posz Law Group, PLC

(57) ABSTRACT

A method for manufacturing a semiconductor device includes preparing a wafer that includes semiconductor elements, placing the wafer on a stage so that a second electrode is in contact with a place surface of the stage, and measuring an on-resistance of at least one of the semiconductor elements with a first measurement terminal and a second measurement terminal. The on-resistance is measured by contacting the first measurement terminal to a first electrode of one of the semiconductor elements to be measured while applying a control signal to a control electrode of the one of the semiconductor elements, contacting the second measurement terminal to a first electrode of another one of the semiconductor elements while applying the control signal to a control electrode of the another one of the semiconductor elements, and measuring a resistance between the first measurement terminal and the second measurement terminal.

8 Claims, 7 Drawing Sheets

(56) References Cited

FOREIGN PATENT DOCUMENTS

| JP | 2013-219269 A | 10/2013 |
|----|---------------|---------|
| JP | 2015-230998 A | 12/2015 |

* cited by examiner

METHOD FOR MANUFACTURING SEMICONDUCTOR DEVICE

CROSS REFERENCE TO RELATED APPLICATION

This application is based on Japanese Patent Application No. 2016-115711 filed on Jun. 9, 2016, the disclosure of which is incorporated herein by reference.

TECHNICAL FIELD

The present disclosure relates to a method for manufacturing a semiconductor device, the method including measuring an on-resistance of a semiconductor element.

BACKGROUND

Conventionally, as described in JP 2013-219269 A, a method has been known to flow current in an element formed in a wafer and evaluate electrical characteristics of the element. One of main electrodes of the element is formed at a front surface of the wafer and the other one of the main electrodes is formed at a rear surface of the wafer.

The wafer is placed on a stage so that the other one of the main electrodes, which is formed at the rear surface of the wafer, is in contact with a place surface of the stage. The place surface of the stage has conductivity. The one of the main electrodes, which is formed at the front surface of the wafer, is in contact with probe pins that are electrically connected to a measurement circuit. The stage has wiring connection terminals at a position different from a position on which the wafer is placed. The wiring connection terminals are electrically connected to the measurement circuit.

SUMMARY

In JP 2013-219269 A, the measurement circuit measures resistances between the probe pins and the wiring connection terminals in order to measure a resistance between the main electrodes of the element. However, there is a possibility that a resistance between the place surface of the stage and the other one of the main electrodes of the element is increased due to a gap between the place surface of the stage and the wafer. In this case, there is a possibility that the resistances between the probe pins and the wiring connection terminals are increased and measurement accuracy of the resistance between the main electrodes of the element is decreased.

It is an object of the present disclosure to provide a method for manufacturing a semiconductor device capable of restricting decrease of measurement accuracy of an on-resistance of a semiconductor element.

According to an aspect of the present disclosure, a method for manufacturing a semiconductor device includes preparing a wafer that includes semiconductor elements. Each of the semiconductor elements is a vertical type semiconductor element and has a first electrode, a second electrode and a control electrode that controls a current flowing between the first electrode and the second electrode according to a control signal. The wafer has the first electrodes and the control electrodes of the semiconductor elements at a front surface of the wafer. The wafer has the second electrode shared by the semiconductor elements at a rear surface of the wafer opposite to the front surface.

The method for manufacturing the semiconductor device includes placing the wafer on a stage so that the second electrode is in contact with a place surface of the stage.

The method for manufacturing the semiconductor device includes measuring an on-resistance of at least one of the semiconductor elements with a first measurement terminal and a second measurement terminal. The on-resistance is measured by contacting the first measurement terminal to the first electrode of one of the semiconductor elements to be measured while applying the control signal to the control electrode of the one of the semiconductor elements, contacting the second measurement terminal to the first electrode of another one of the semiconductor elements while applying the control signal to the control electrode of the another one of the semiconductor elements, and measuring a resistance between the first measurement terminal and the second measurement terminal.

The second electrode formed at the rear surface of the wafer is shared by the one of the semiconductor elements and the another one of the semiconductor elements. A current flowing between the first measurement terminal and the second measurement terminal only passes through the second electrode as an electrical pathway between the one of the semiconductor elements and the another one of the semiconductor elements.

In this case, even when a resistance between the stage and the wafer is increased, a resistance between the first measurement terminal and the second measurement terminal is less likely to be increased. As a result, decrease of measurement accuracy of the on-resistance of the semiconductor element is restricted.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Embodiments of the present disclosure will be described with reference to the drawings. In the following embodiments, elements that are common or relative with each other will be designated with the same symbols. A thickness direction of an n+ type substrate will be referred to as Z direction. A direction orthogonal to the Z direction will be referred to as X direction. A direction orthogonal to the Z direction and the X direction will be referred to as Y direction.

First Embodiment

Figure 1:
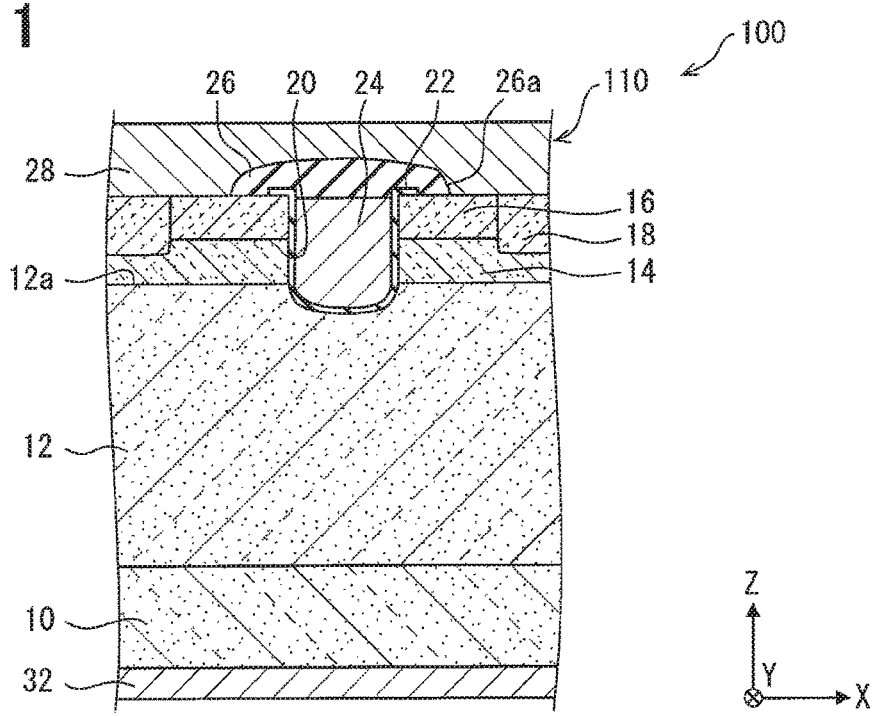
FIG. 1 is a cross-sectional view illustrating a schematic structure of a semiconductor device according to a first embodiment.

A schematic structure of a semiconductor device 100 will be described with reference to FIG. 1 and FIG. 2.

A semiconductor chip may be employed as the semiconductor device 100. The semiconductor device 100 includes at least one semiconductor element 110. In the present embodiment, a trench gate type MOSFET that includes an SiC (silicon carbide) substrate is employed as the semiconductor element 110. That is, in the present embodiment, a vertical type element is employed as the semiconductor element 110. The semiconductor element 110 includes an n+ type substrate 10, an n− type region 12, a body region 14, a source region 16 and a body contact region 18.

The n+ type substrate 10 is an SiC substrate having n type. The n− type region 12 is formed on a first surface of the n+ type substrate 10 in the Z direction. The n− type region 12 provides a drift layer. The n type region 12 has an impurity concentration lower than that of the n+ type substrate 10. The p type body region 14 is formed on a first surface 12a of the n− type region 12 that is opposite to the n+ type substrate 10. The body region 14 provides a channel. The n− type source region 16 and the p+ type body contact region 18 are formed opposite to the n− type region 12 with respect to the body region 14. That is, the body region 14 is formed between the source region 16 and the n− type region 12, and between the body contact region 18 and the n− type region 12.

The semiconductor element 110 has a trench 20. The trench 20 penetrates the body region 14 and the source region 16 in the Z direction. The trench 20 has a depth from the first surface 12a of the n− type region 12 in the Z direction.

The semiconductor element 110 has a gate insulation film 22, a gate region 24, an inter-layer insulation film 26, a source electrode 28, a gate electrode 30 and a drain electrode 32. The gate insulation film 22 covers an inner wall surface of the trench 20. The gate region 24 is disposed in the trench 20 through the gate insulation film 22. That is, the gate insulation film 22 is disposed between the gate region 24 and the inner wall surface of the trench 20. The gate region 24 and the gate electrode 30 are electrically connected with each other. The gate region 24 and the gate electrode 30 may be collectively referred to as a gate electrode.

The inter-layer insulation film 26 insulates the gate region 24 and the source electrode 28. The inter-layer insulation film 26 is formed opposite to the n− type region 12 with respect to the gate region 24. That is, the inter-layer insulation film 26 is formed between the gate region 24 and the source electrode 28. The inter-layer insulation film 26 has a contact hole 26a such that the source electrode 28 is in contact with the source region 16 and the body contact region 18.

At a position of the contact hole 26a, the source electrode 28 is formed opposite to the body region 14 with respect to the source region 16 and the body contact region 18. That is, at the position of the contact hole 26a, the source region 16 and the body contact region 18 are disposed between the source electrode 28 and the body region 14. A surface of the source electrode 28 opposite to the source region 16, the body contact region 18 and the inter-layer insulation film 26 defines an end surface of the semiconductor element 110. The source electrode 28 corresponds to a first electrode.

Figure 2:
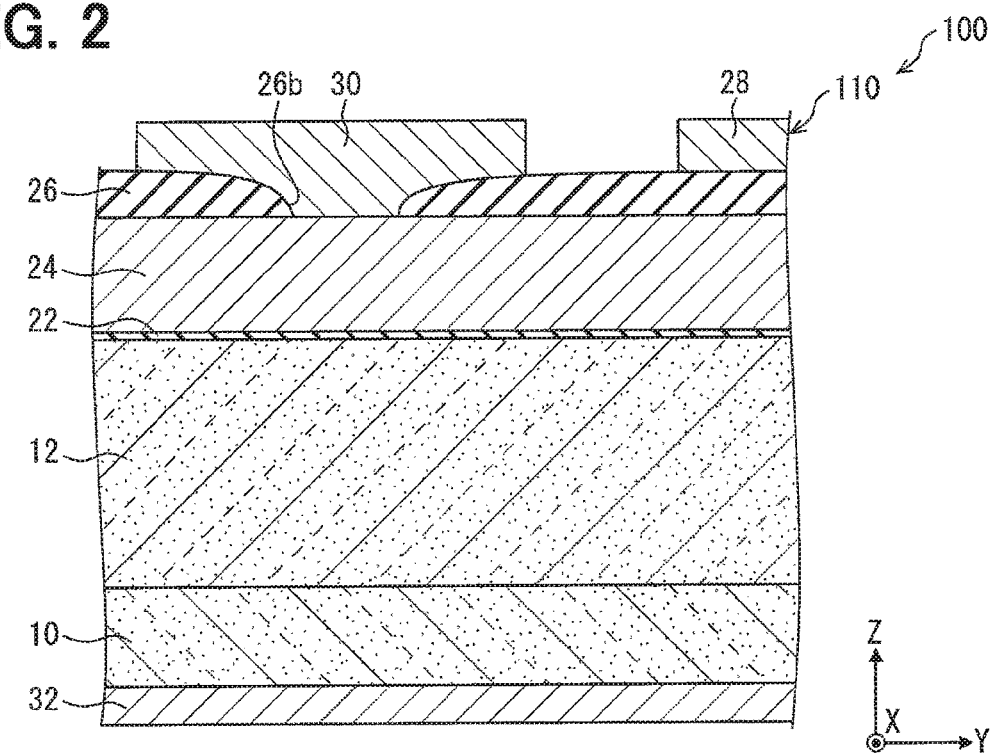
FIG. 2 is a cross-sectional view illustrating a schematic structure of a semiconductor device according to a first embodiment.

As shown in FIG. 2, the inter-layer insulation film 26 has a contact hole 26b different from the contact hole 26a such that the gate electrode 30 is in contact with the gate region 24. At a position of the contact hole 26b, the gate electrode 30 is disposed opposite to the n− type region 12 with respect to the gate region 24 and the gate electrode 30 is in contact with the gate region 24. That is, the gate region 24 is disposed between the gate electrode 30 and the n− type region 12 and the gate electrode 30 is in contact with the gate region 24. A surface of the gate electrode 30 opposite to the gate region 24 and the inter-layer insulation film 26 defines an end surface of the semiconductor element 110. Namely, the source electrode 28 and the gate electrode 30 are formed at a first end surface of the semiconductor element 110.

A drain electrode 32 is formed opposite to the n− type region 12 with respect to the n+ type substrate 10. That is, the n+ type substrate 10 is disposed between the n− type region 12 and the drain electrode 32. A second surface of the drain electrode 32 that is opposite to the n+ type substrate 10 defines a second end surface of the semiconductor element 110. The second end surface of the semiconductor element 110 is opposite to the first end surface at which the source electrode 28 and the gate electrode 30 are formed. Namely, in the semiconductor element 110, the source electrode 28 and the gate electrode 30 are formed at the first end surface, and the drain electrode 32 is formed at the second end surface opposite to the first end surface. The drain electrode 32 corresponds to a second electrode.

In the semiconductor element 110, when a gate voltage is applied to the gate region 24, a portion of the body region 14 that is in contact with the gate insulation film 22 is inversed into n type and the portion of the body region 14 serves as a channel. As a result, a current flows between the source electrode 28 and the drain electrode 32. The gate electrode 30 corresponds to a control electrode and the gate voltage corresponds to a control signal.

Next, a method for manufacturing the semiconductor device 100 will be described with reference to FIG. 3 to FIG. 10.

Figure 3:
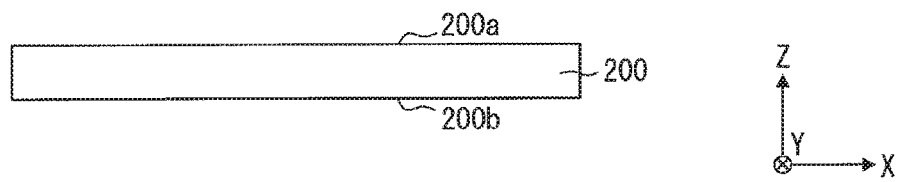
FIG. 3 is a side view illustrating a structure of a wafer.
Figure 4:
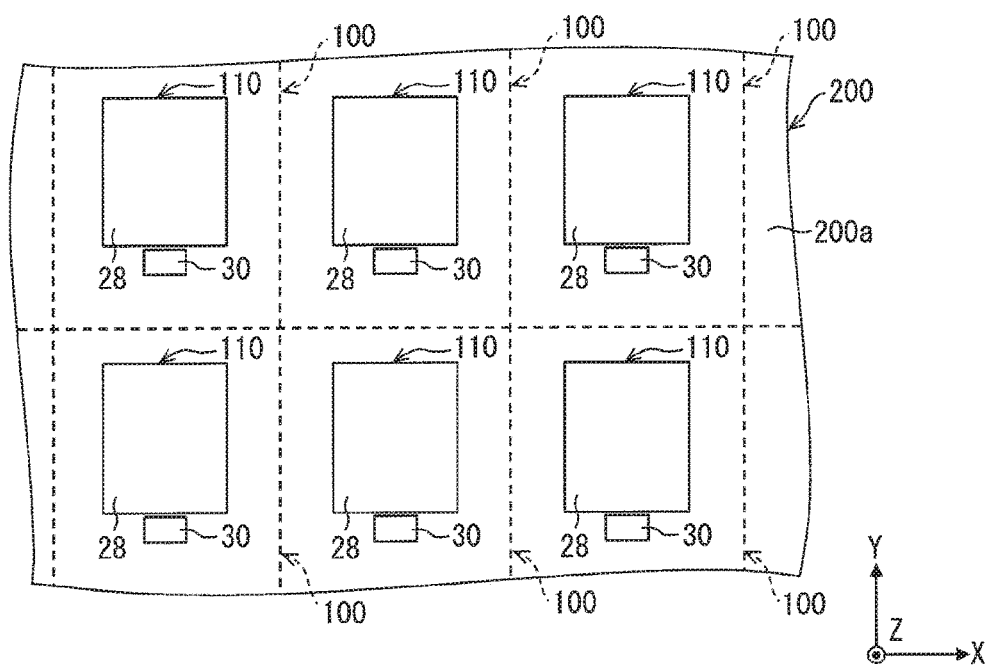
FIG. 4 is a plan view illustrating the structure of the wafer.

First, a preparing step preparing a wafer 200 shown in FIG. 3 and FIG. 4 is performed. The wafer 200 has a plate shape and a thickness direction of the wafer 200 extends along the Z direction. As shown in FIG. 3, the wafer 200 has a front surface 200a and a rear surface 200b opposite to the front surface 200a. The wafer 200 includes multiple semiconductor devices 100. That is, the wafer 200 includes multiple semiconductor elements 110 shown in FIG. 1. In other words, in the preparing step, the wafer 200 including multiple MOSFETs as the semiconductor elements 110 is prepared. The wafer 200 is formed of SiC. The MOSFETs may be manufactured by generally known methods.

As shown in FIG. 4, the semiconductor elements 110 are arranged in the X direction and the Y direction in the wafer 200. The source electrodes 28 respectively corresponding to the semiconductor elements 110 are formed at the front surface 200a. In other words, the source electrodes 28 respectively corresponding to the semiconductor elements 110 are exposed from the front surface 200a.

Similarly, the gate electrodes 30 respectively corresponding to the semiconductor elements 110 are formed at the front surface 200a. In other words, the gate electrodes 30 respectively corresponding to the semiconductor elements 110 are exposed from the front surface 200a. In FIG. 4, dicing lines are shown by broken lines.

The drain electrode 32 is formed at an entire surface of the rear surface 200b. That is, the semiconductor elements 110 formed in the wafer 200 have common drain electrode 32. In other words, the drain electrode 32 is shared by the semiconductor elements 110 and is exposed from the rear surface 200b.

After the preparing step, a measuring step measuring on-resistances of the semiconductor elements 110 is performed. In the measuring step, the on-resistances of the semiconductor elements 110 are measured to test whether the semiconductor devices 100 are defective. The measuring step may be referred to as a testing step.

Figure 5:
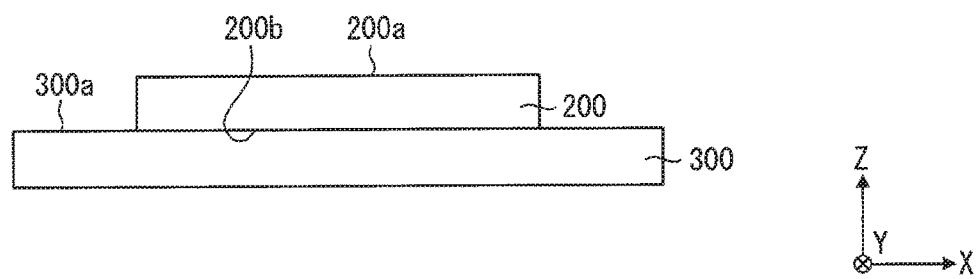
FIG. 5 is a side view illustrating a measuring step.

In the measuring step, as shown in FIG. 5, the wafer 200 is placed on a place surface 300a of a stage 300. The wafer 200 is placed on the stage 300 such that the entire rear surface 200b is in contact with the place surface 300a. That is, the wafer 200 is placed on the stage 300 such that the drain electrode 32 is in contact with the place surface 300a. The rear surface 200b and the place surface 300a are almost flat surfaces.

The stage 300 is formed of metal. Therefore, the stage 300 has conductivity. In details, at least a part of the stage 300 providing the place surface 300a is formed of metal. When the wafer 200 is placed on the stage 300, the drain electrode 32 is electrically connected to the stage 300. That is, when the wafer 200 is placed on the stage 300, the semiconductor elements 110, which are formed in the wafer 200, are electrically connected to the stage 300.

As a method for fixing the wafer 200 to the stage 300, for example, vacuuming by a vacuum pump may be considered. In this method, a groove or a hole is provided at the place surface 300a of the stage 300 and the vacuuming is performed through the groove or the hole. As such, the rear surface 200b of the wafer 200 is adsorbed and fixed to the place surface 300a.

Figure 6:
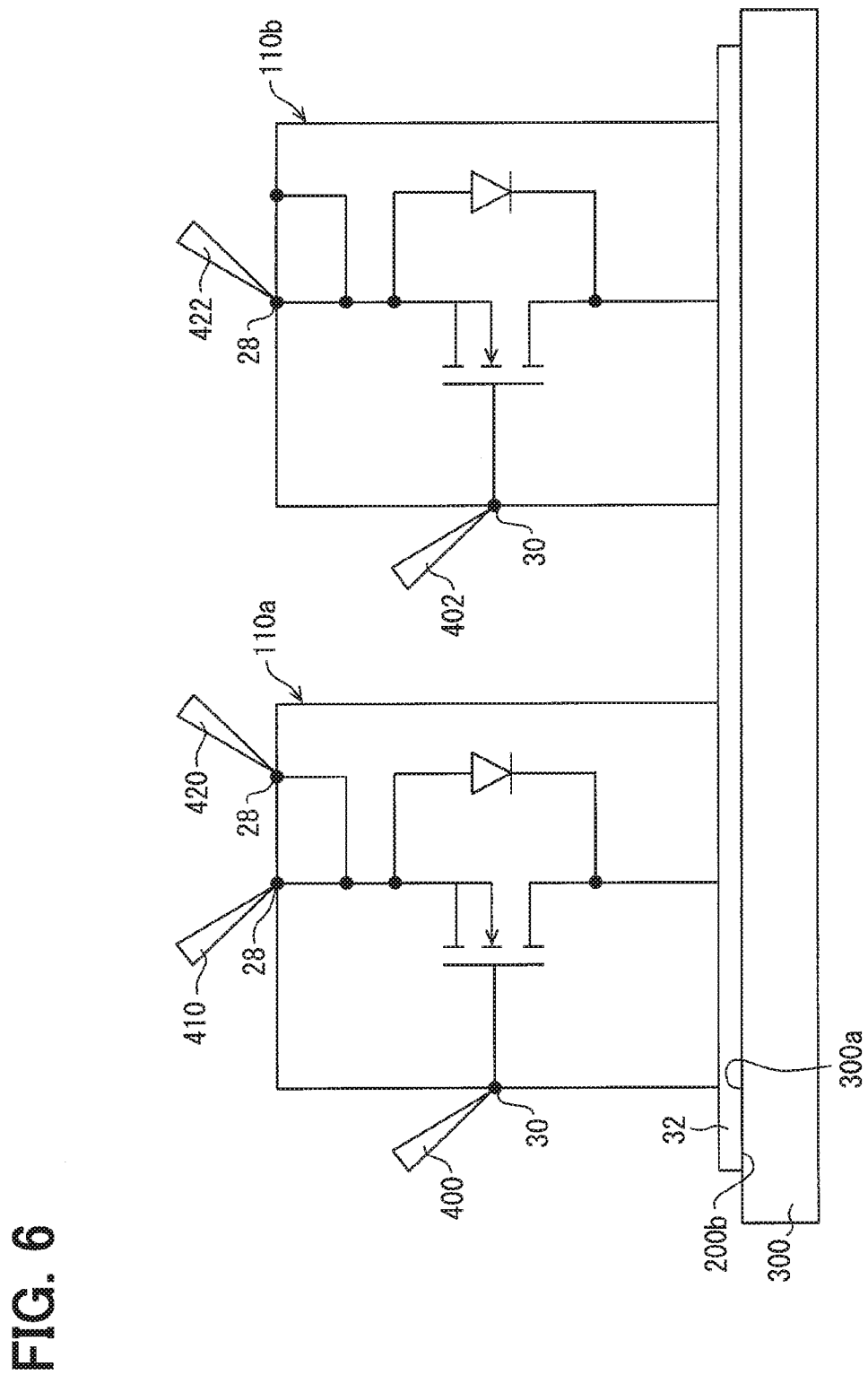
FIG. 6 is a circuit diagram illustrating the measuring step.

In the measuring step, after the wafer 200 is placed on the stage 300, the on-resistances of the semiconductor elements 110 are measured as shown in FIG. 6. Hereinafter, one of the semiconductor elements 110 whose on-resistance is to be measured will be referred to as a measurement element 110a. In the present embodiment, another one of the semiconductor elements 110 different from the measurement element 110a is employed to measure the on-resistance of the measurement element 110a. Hereinafter, the another one of the semiconductor elements 110, which is different from the measurement element 110a and is employed to measure the on-resistance of the measurement element 110a, will be referred to as a non-measurement element 110b. In FIG. 6, a structure of each of the semiconductor elements 110 is illustrated as an equivalent circuit.

In the present embodiment, one of the semiconductor elements 110 adjacent to the measurement element 110a in the wafer 200 is employed as the non-measurement element 110b. That is, the non-measurement element 110b is formed next to the measurement element 110a. The one of the semiconductor elements 110 adjacent to the measurement element 110a in the wafer 200 includes one of the semiconductor elements 110 adjacent to the measurement element 110a in the X direction or in the Y direction.

In the measuring step of the present embodiment, on-resistances of all of the semiconductor elements 110 formed in the wafer 200 are measured. The on-resistances are measured so that a distance between the measurement element 110a and the non-measurement element 110b is the same for each of the semiconductor elements 110. In other words, for each of the semiconductor elements 110, a distance between each pairs of the measurement element 110a and the non-measurement element 110b is the same in the wafer 200.

In each of the measurements of the semiconductor elements 110, one of the semiconductor elements 110 adjacent to the measurement element 110a is employed as the non-measurement element 110b.

The measurement device for measuring the on-resistance of the measurement element 110a has terminals. In the measuring step, a probe terminal 400 is contacted to the gate electrode 30 of the measurement element 110a to apply a gate voltage to the gate electrode 30 of the measurement element 110a. As such, the measurement element 110a is turned on. A probe terminal 402 is contacted to the gate electrode 30 of the non-measurement element 110b to apply a gate voltage to the gate electrode 30 of the non-measurement element 110b. As such, the non-measurement element 110b is turned on.

A force terminal 410 is contacted to the source electrode 28 of the measurement element 110a to apply a voltage to the source electrode 28. As such, predetermined current flows in the measurement element 110a and the non-measurement element 110b. That is, the voltage is applied to the source electrode 28 of the measurement element 110a to flow the predetermined current in the measurement element 110a and the non-measurement element 110b.

A sense terminal 420 is contacted to the source electrode 28 of the measurement element 110a and a sense terminal 422 is contacted to the source electrode 28 of the non-measurement element 110b. As such, a voltage between the source electrode 28 of the measurement element 110a and the source electrode 28 of the non-measurement element 110b is measured. The sense terminal 420 corresponds to a first measurement terminal. The sense terminal 422 corresponds to a second measurement terminal.

Accordingly, the voltage between the source electrode 28 of the measurement element 110a and the source electrode 28 of the non-measurement element 110b is measured while applying the predetermined current between the source electrode 28 of the measurement element 110a and the source electrode 28 of the non-measurement element 110b.

In the above measurement, electrons flow from the source electrode 28 of the measurement element 110a to the source electrode 28 of the non-measurement element 110b through the drain electrode 32. Namely, the current flows from the source electrode 28 of the non-measurement element 110b to the source electrode 28 of the measurement element 110a through the drain electrode 32.

The current flowing between the sense terminals 420 and 422 includes a current flowing from the drain electrode 32 and returning to the drain electrode 32 through the stage 300, and a current flowing only in the drain electrode 32 without the stage 300. In other words, the current flowing between the sense terminals 420 and 422 includes a current passing through the stage 300 and a current not passing through the stage 300.

The on-resistance of the measurement element 110a is calculated based on the voltage between the sense terminals 420 and 422, and the current flowing in the measurement element 110a. In the present embodiment, the on-resistance of the measurement element 110a is obtained by dividing the voltage between the sense terminals 420 and 422 with the current flowing in the measurement element 110a.

Figure 7:
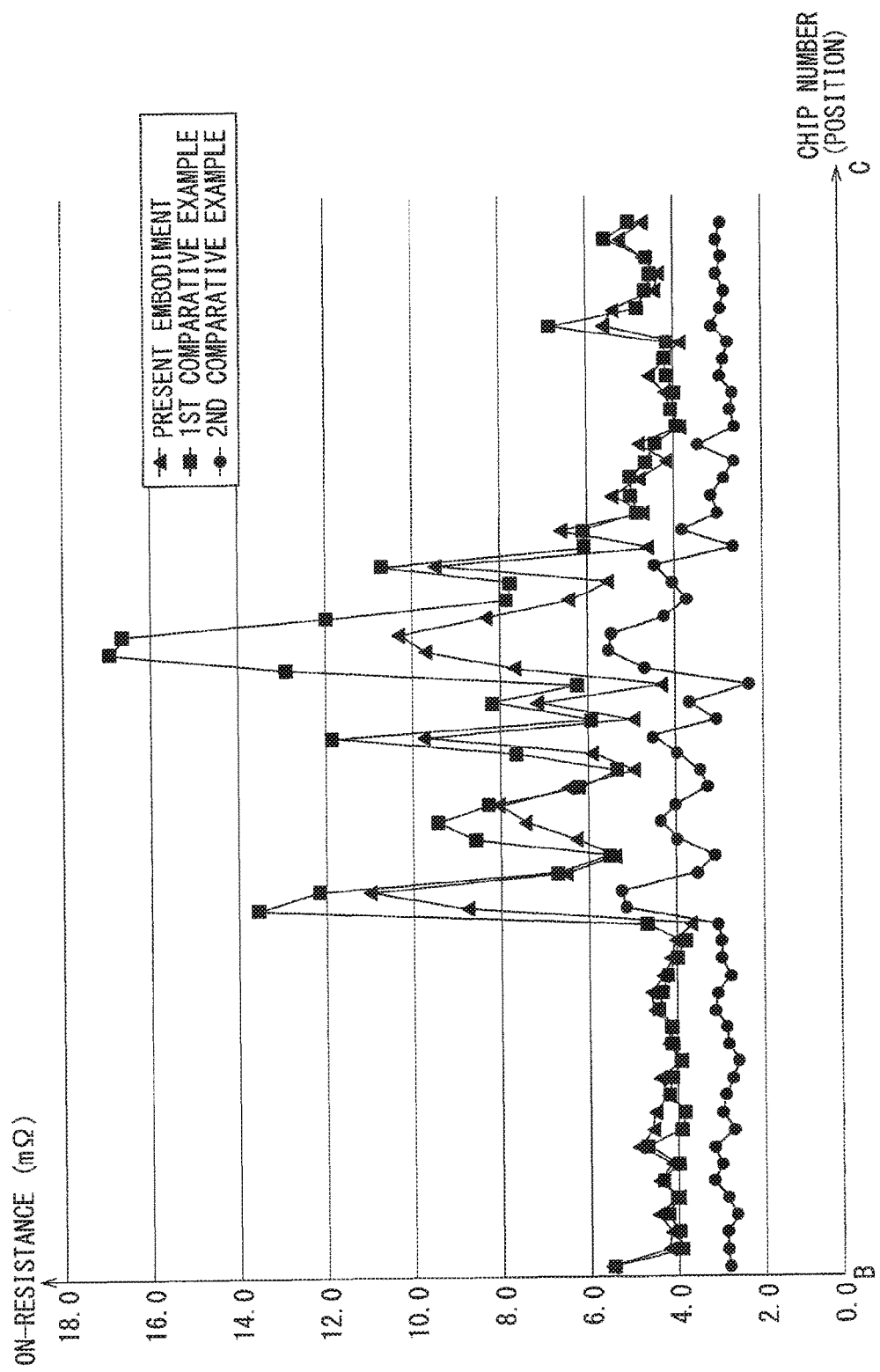
FIG. 7 is a diagram illustrating measurement results of on-resistances of semiconductor elements.

In FIG. 7, on-resistances of the measurement elements 110a, measured by the above measuring method, are shown by triangle markers. Also in FIG. 7, on-resistances of the semiconductor elements, measured by other measuring methods, are shown by square markers and circle markers, as two comparative examples. The square markers describe a first comparative example, and the circuit markers describe a second comparative example.

Figure 8:
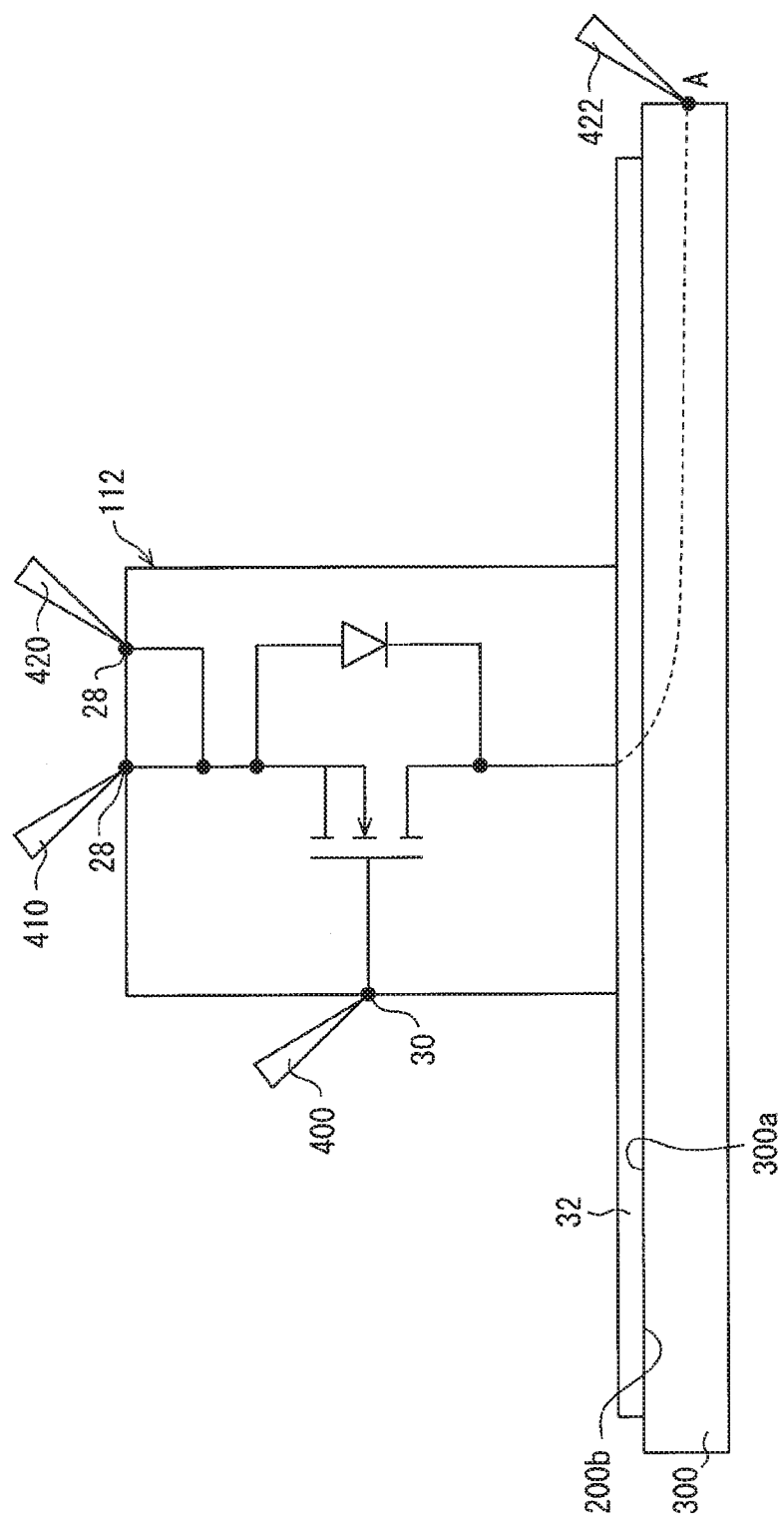
FIG. 8 is a circuit diagram illustrating measuring method of on-resistances of semiconductor elements of a first comparative example.

Hereinafter, in the first comparative example, a semiconductor element whose on-resistance is measured will be referred to as a semiconductor element 112. The semiconductor element 112 has the same structure as the semiconductor element 110 of the present embodiment. As shown in FIG. 8, in the first comparative example, the sense terminal 422 is not contacted to the source electrode 28 of the non-measurement element 110b but contacted to a point A of the stage 300. The voltage between the source electrode 28 of the semiconductor element 112 and the point A of the stage 300 is measured while applying the predetermined current between the source electrode 28 of the semiconductor element 112 and the point A of the stage 300. As shown by a broken line in FIG. 8, the current flows in the stage 300 through the drain electrode 32.

Figure 9:
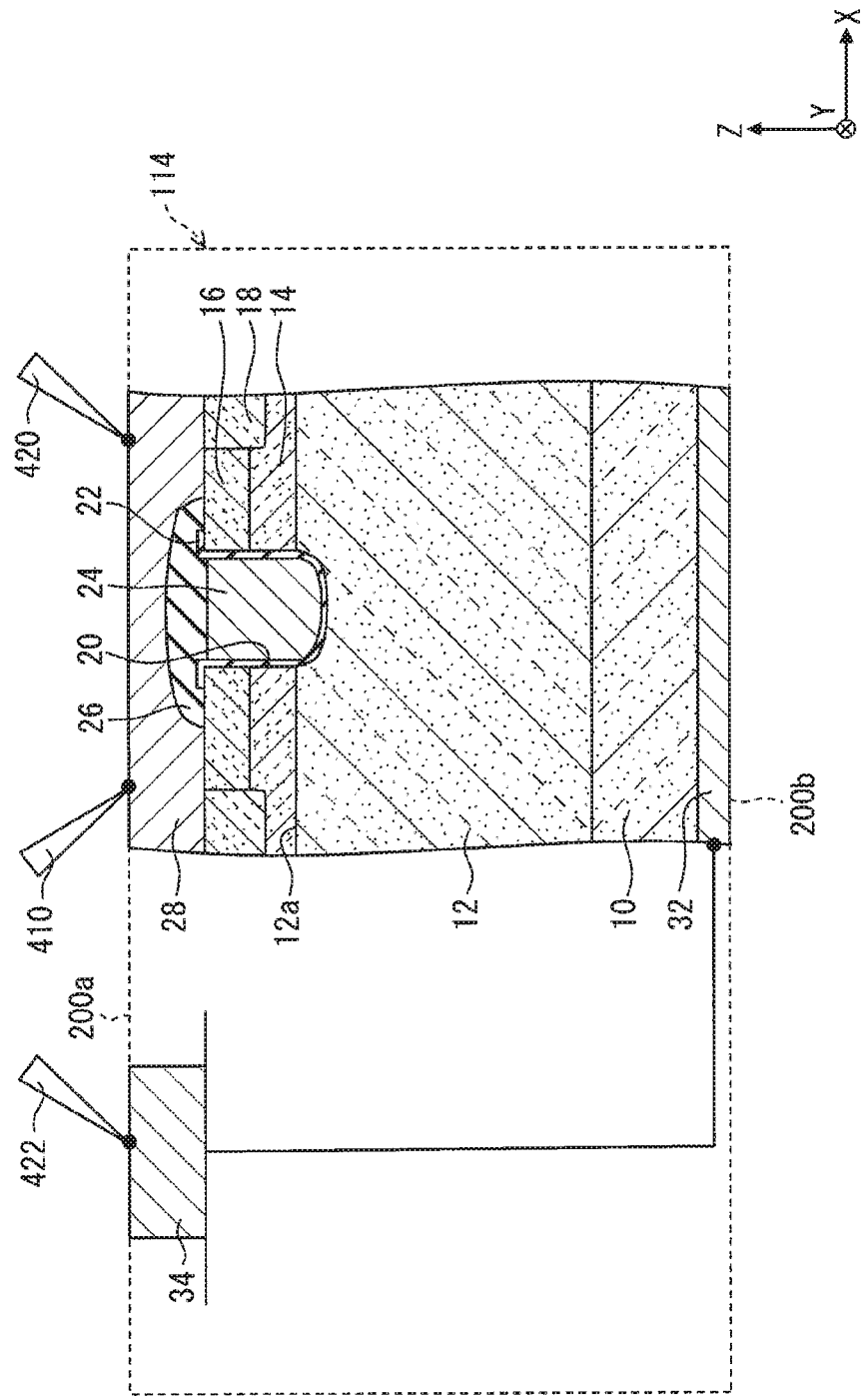
FIG. 9 is a cross-sectional view illustrating measuring method of on-resistances of semiconductor elements of a second comparative example.

Hereinafter, in the second comparative example, a semiconductor element whose on-resistance is measured will be referred to as a semiconductor element 114. As shown in FIG. 9, the semiconductor element 114 has a structure different from the semiconductor element 110 of the present embodiment. The semiconductor element 114, differently from the semiconductor element 110, has a measurement electrode 34 for measuring an electrical potential of the drain electrode 32.

The measurement electrode 34 is connected to the drain electrode 32 defining the rear surface 200b of the wafer 200. The measurement electrode 34 extends in the Z direction. A part of the measurement electrode 34 is exposed from the front surface 200a. The drain electrode 32 may be considered to be exposed from the front surface 200a. In the second comparative example, the sense terminal 422 is not contacted to the source electrode 28 of the non-measurement element 110b but contacted to the measurement electrode 34 of the semiconductor element 114. The voltage between the source electrode 28 of the semiconductor element 114 and the measurement electrode 34 is measured while applying the predetermined current between the source electrode 28 of the semiconductor element 114 and the measurement electrode 34. In the second comparative example, little current flows in the stage 300.

Horizontal axis of a graph of FIG. 7 expresses chip numbers indicating positions where the semiconductor elements are formed in the wafer 200. In the present embodiment, the first comparative example, and the second comparative example, the on-resistances indicated by the same chip numbers correspond to the on-resistances of the semiconductor elements 110, 112 and 114 formed at the same position in the wafer 200.

Figure 10:
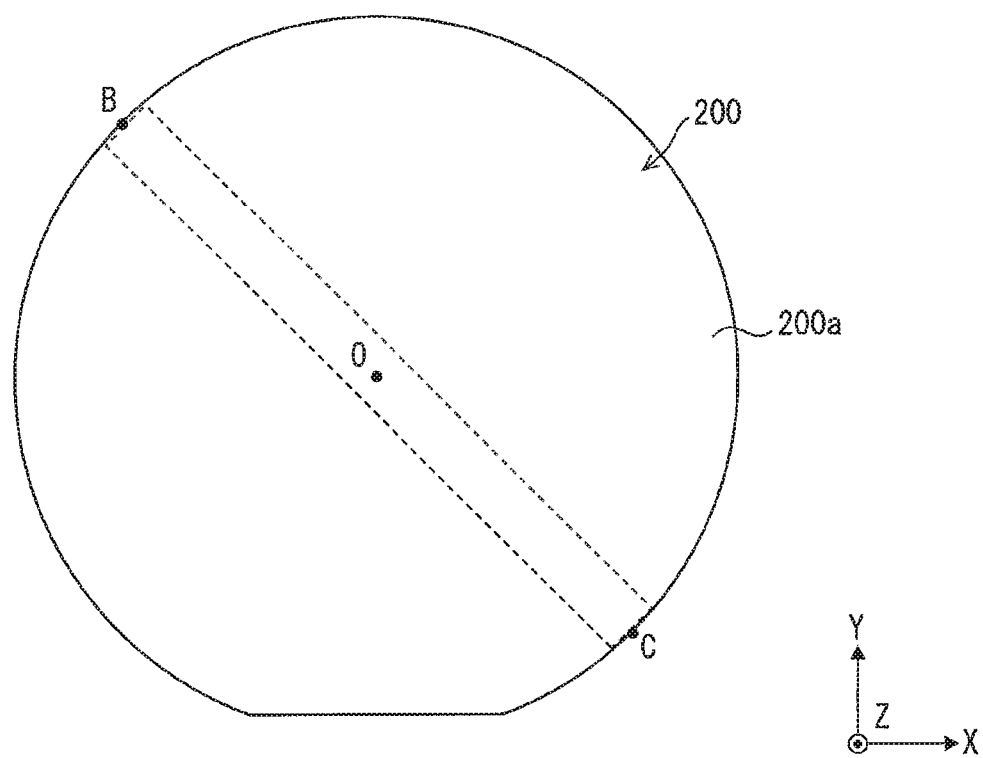
FIG. 10 is a plan view illustrating a range of the wafer in which the semiconductor elements, whose measurement results are shown in FIG. 7, are formed.

In FIG. 10, a range is shown by a broken line in which the semiconductor elements 110, 112 and 114, whose measurement results are shown in FIG. 7, are formed in the wafer 200. In FIG. 10, one end of the wafer 200 is shown by a point B and the other end of the wafer 200 is shown by a point C. The above range extends straight from the point B to the point C through a center O of the wafer 200 in XY plane.

In FIG. 7, the chip numbers are increased as the semiconductor elements 110, 112 and 114 are further from the point B. In the first comparative example, the point A, at which the sense terminal 422 is contacted to the stage 300, is close to the point C of the wafer 200. That is, in the first comparative example, one of the semiconductor elements 112 having larger chip number is closer to the sense terminal 422.

As shown in FIG. 7, in the present embodiment, the first comparative example and the second comparative example, the semiconductor elements 110, 112 and 114 formed close to the center O of the wafer 200 have higher on-resistances. It may be assumed that, for example, a gap is formed between the portion of the rear surface 200b near the center and the place surface 300a due to crooks or asperity of the place surface 300a. When the gap is formed, the resistance between the wafer 200 and the stage 300 is increased.

In the second comparative example, the current between the sense terminals 420 and 422 flows from the measurement electrode 34 of the semiconductor element 114 to the source electrode 28 through the drain electrode 32. Accordingly, in the second comparative example, the current is less likely to pass through the stage 300. Therefore, in the second comparative example, compared to the present embodiment and the first comparative example, an influence of the gap between the rear surface 200b and the place surface 300a is reduced, and thus the measurement accuracy of the on resistance is increased.

In the first comparative example, the sense terminal 422 is contacted to the stage 300. The current between the sense terminals 420 and 422 always passes through the stage 300. As described above, in the present embodiment, the current flowing between the sense terminals 420 and 122 includes the current passing through the stage 300 and the current not passing through the stage 300.

Namely, in the present embodiment, the current applied for measuring the on-resistance does not necessarily flow between the rear surface 200b and the place surface 300a. Accordingly, in the present embodiment, compared to the first comparative example, the influence of the gap between the rear surface 200b and the place surface 300a is reduced, and thus the measurement accuracy of the on-resistance is increased.

After the measuring step is performed, a dicing step cutting the wafer 200 into chips is performed. When the on-resistance of the semiconductor element 110 is determined to be abnormal in the measuring step, the semiconductor device 100 having such a semiconductor element 110 is determined to be defective, and the semiconductor device 100 is not employed in the steps after the dicing step.

Next, effects of the above method for manufacturing the semiconductor device 100 will be described.

In the present embodiment, when the resistance between the stage 300 and the wafer 200 is increased, at least a part of the current flowing between the sense terminals 420 and 422 only passes through the drain electrode 32 as an electrical pathway. Therefore, even when the resistance between the stage 300 and the wafer 200 is increased, the resistance between the sense terminals 420 and 422 is less likely to be increased. Accordingly, in the present embodiment, decrease of the measurement accuracy of the on-resistance of the measurement element 110a is restricted.

In the present embodiment, it is not necessary to dispose the measurement electrode 34 that is connected to the drain electrode 32 in the semiconductor element 110, as the second comparative example. Therefore, the steps of manufacturing the wafer 200 are simplified and manufacturing cost of the wafer 200 is reduced.

As described above, in the semiconductor element 114 of the second comparative example, the source electrode 28, the gate electrode 30 and the measurement electrode 34 are formed in one surface. In this case, distances between the electrodes are short and when the high voltage is applied to the semiconductor element 114, the semiconductor element 114 is likely to be discharged. That is, in the second comparative example, it is less preferable to apply high voltage to the semiconductor element 114.

Conversely, in the semiconductor element 110 of the present embodiment, the measurement electrode 34 is not disposed and thus the distances between the electrodes are restricted from being short compared to the second comparative example. Therefore, in the present embodiment, high voltage may be applied to the semiconductor element 110.

In the present embodiment, one of the semiconductor elements 110 adjacent to the measurement element 110*a* is employed as the non-measurement element 110*b* for measuring the on-resistance of the measurement element 110*a*. As a result, compared to a method in which the non-measurement element 110*b* is far from the measurement element 110*a* in the wafer 200, the resistances of the drain electrode 32 and the stage 300 disposed between the measurement element 110*a* and the non-measurement element 110*b* are reduced. That is, the resistance between the sense terminals 420 and 422 is decreased and decrease of the measurement accuracy of the on-resistance of the measurement element 110*a* is effectively restricted.

In the present embodiment, the distance between the measurement element 110*a* and the non-measurement element 110*b* is the same for each of the measurements of the on-resistances of the semiconductor elements 110. As a result, it is restricted that the resistances of the drain electrode 32 and the stage 300 disposed between the measurement element 110*a* and the non-measurement element 110*b* are not the same in the semiconductor elements 110. That is, the measurement accuracy of the on-resistance of the measurement element 110*a* is restricted from varying in the semiconductor elements 110.

In the present embodiment, the stage 300 has conductivity e properties. When the wafer 200 is placed on the stage 300, the drain electrode 32 is electrically connected to the stage 300. As a result, the electrical pathway of the current flowing between the sense terminals 420 and 422, that is, between the measurement element 110*a* and the non-measurement element 110*b*, includes a pathway passing through the stage 300 from the drain electrode 32 and returning to the drain electrode 32, in addition to a pathway only passing through the drain electrode 32. Compared to a case where the stage 300 does not have conductivity, the resistance between the sense terminals 420 and 422 is reduced, and the decrease of the measurement accuracy of the on-resistance of the measurement element 110*a* is restricted.

Other Embodiments

Although the embodiments of the present disclosure are described hereinabove, the present disclosure is not limited to the embodiments described above and may be implemented in various other ways without departing from the gist of the present disclosure.

In the above embodiments, the example is described in which the trench gate type MOSFET is employed as the semiconductor element 110. However, the semiconductor element 110 is not limited to the example. An IGBT may be employed as the semiconductor element 110. In this example, an emitter electrode and a gate electrode of the IGBT are formed at the front surface 200*a* of the wafer 200 and a collector electrode of the IGBT is formed at the rear surface 200*b* of the wafer 200. Therefore, the emitter electrode of the IGBT corresponds to the first electrode and the collector electrode of the IGBT corresponds to the second electrode.

In the above embodiments, the example is described in which the on-resistance of the measurement element 110*a* is obtained by dividing the voltage between the sense terminals 420 and 422 with the current flowing in the measurement element 110*a*. However, the present disclosure is not limited to the example. The on-resistance of the measurement element 110*a* may be obtained by further dividing, with 2, the value obtained by dividing the voltage between the sense terminals 420 and 422 with the current flowing in the measurement element 110*a*. In this case, a value assumed as one of the on-resistance of the measurement element 110*a* and the non-measurement element 110*b* is calculated, instead of a value including both of the on-resistances of the measurement element 110*a* and the non-measurement element 110*b*.

The on-resistance of the measurement element 110*a* may be obtained by subtracting a value assumed as the on-resistance of the non-measurement element 110*b* from the value obtained by dividing the voltage between the sense terminals 420 and 422 with the current flowing in the measurement element 110*a*. The value assumed as the on-resistance of the measurement element 110*b* is, for example, an average value of the on-resistances of the semiconductor elements formed in the wafer 200, or an on-resistance of a semiconductor element formed in other wafer 200. The semiconductor element formed in the other wafer 200 is, for example, a semiconductor element having the structure similar to the second comparative example.

In the above embodiments, the example is described in which each distance between the measurement element 110*a* and the non-measurement element 110*b* is the same in the semiconductor elements 110. However, the present disclosure is not limited to the example. The distance between the measurement element 110*a* and the non-measurement element 110*b* may be different in the semiconductor elements 110.

In the above embodiments, the example is described in which one non-measurement element 110*b* is employed for measuring the on-resistance of one measurement element 110*a* in the measuring step. However, the present disclosure is not limited to the example. Multiple non-measurement elements 110*b* may be employed for measuring the on-resistance of one measurement element 110*a*. In this case, one of the multiple non-measurement elements 110*b* is employed for measuring the on-resistance of the measurement element 110*a*, and then another one of the multiple non-measurement elements 110*b* is employed for measuring the on-resistance of the same measurement element 110*a*.

When the measurement element 110*a* is defective, the voltage between the sense terminals 420 and 422 is abnormal in all measurements with the multiple non-measurement elements 110*b*. On the other hand, when the voltage between the sense terminals 420 and 422 is abnormal only in the measurement with one of the multiple non-measurement elements 110*b*, the measurement element 110*a* is not determined to be defective, but the one of the multiple non-measurement elements 110*b* is determined to be defective. Accordingly, the measurement element 110*a* is not erroneously determined to be defective when the non-measurement element 110*b* is defective.

In the above embodiments, the example is described in which the on-resistances of all of the semiconductor elements 110 formed in the wafer 200 are measured. However, the present disclosure is not limited to the example. The on-resistance of at least one of the semiconductor elements 110 may be measured.

In the above embodiments, the example is described in which the stage 300 has conductivity. However, the present disclosure is not limited to the example. A structure in which the stage 300 does not have conductivity may be considered. For example, the stage 300 may be formed of resin having insulation properties.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A method for manufacturing a semiconductor device, the method comprising:
    preparing a wafer that includes a plurality of semiconductor elements, each of the plurality of semiconductor elements being a vertical type semiconductor element and having a first electrode, a second electrode and a control electrode that controls a current flowing between the first electrode and the second electrode according to a control signal, the wafer having the first electrodes and the control electrodes of the plurality of semiconductor elements at a front surface of the wafer, and the wafer having the second electrode shared by the plurality of semiconductor elements at a rear surface of the wafer opposite to the front surface;
    placing the wafer on a stage so that the second electrode is in contact with a place surface of the stage; and
    measuring an on-resistance of at least one of the plurality of semiconductor elements with a first measurement terminal and a second measurement terminal by
        contacting the first measurement terminal to the first electrode of one of the plurality of semiconductor elements to be measured while applying the control signal to the control electrode of the one of the plurality of semiconductor elements,
        contacting the second measurement terminal to the first electrode of another one of the plurality of semiconductor elements while applying the control signal to the control electrode of the another one of the plurality of semiconductor elements, and
        measuring a resistance between the first measurement terminal and the second measurement terminal.

2. The method for manufacturing the semiconductor device according to claim 1, wherein
    in the measuring the on-resistance, the another one of the plurality of semiconductor elements is adjacent to the one of the plurality of semiconductor elements to be measured in the wafer.

3. The method for manufacturing the semiconductor device according to claim 1, wherein
    in the measuring the on-resistance, on-resistances of multiple ones of the plurality of semiconductor elements are measured, and
    for each of the multiple ones of the plurality of semiconductor elements, a distance is the same between the one of the plurality of semiconductor elements to be measured and the another one of the plurality of semiconductor elements in the wafer.

4. The method for manufacturing the semiconductor device according to claim 1, wherein
    at least a part of the stage providing the place surface has conductivity.

5. The method for manufacturing the semiconductor device according to claim 1, wherein
    the plurality of semiconductor elements includes a MOSFET.

6. The method for manufacturing the semiconductor device according to claim 1, wherein
    the plurality of semiconductor elements includes an IGBT.

7. The method for manufacturing the semiconductor device according to claim 1, wherein
    the wafer is formed of a silicon carbide.

8. The method for manufacturing the semiconductor device according to claim 1, further comprising:
    cutting the wafer into chips after the measuring the on-resistance.

* * * * *